United States Patent [19]
Gardner et al.

[11] Patent Number: 5,923,980
[45] Date of Patent: *Jul. 13, 1999

[54] TRENCH TRANSISTOR WITH LOCALIZED SOURCE/DRAIN REGIONS IMPLANTED THROUGH VOIDS IN TRENCH

[75] Inventors: Mark I. Gardner, Cedar Creek; H. Jim Fulford, Jr.; Frederick N. Hause, both of Austin, all of Tex.

[73] Assignee: Advanced Micro Devices, Inc., Sunnyvale, Calif.

[ * ] Notice: This patent is subject to a terminal disclaimer.

[21] Appl. No.: 08/739,592

[22] Filed: Oct. 30, 1996

Related U.S. Application Data

[51] Int. Cl.$^6$ .......................... H01L 21/00; H01L 21/265
[52] U.S. Cl. .......................... 438/270; 438/282; 438/151; 438/589; 257/262
[58] Field of Search .................... 438/270, 282, 438/151, 589, 67; 257/262

[56] References Cited

U.S. PATENT DOCUMENTS

| | | | |
|---|---|---|---|
| 4,745,086 | 5/1988 | Parillo et al. | 437/57 |
| 4,830,975 | 5/1989 | Bovaird et al. | 437/41 |
| 5,141,891 | 8/1992 | Arima et al. | 437/44 |
| 5,166,084 | 11/1992 | Pfiester | 437/40 |
| 5,175,118 | 12/1992 | Yoneda | 437/40 |
| 5,231,038 | 7/1993 | Yamaguchi et al. | 437/40 |
| 5,362,662 | 11/1994 | Ando et al. | 437/52 |
| 5,399,515 | 3/1995 | Davis et al. | 438/270 |
| 5,504,031 | 4/1996 | Hsu et al. | 437/57 |
| 5,512,506 | 4/1996 | Chang et al. | 437/44 |
| 5,538,913 | 7/1996 | Hong | 437/44 |
| 5,545,579 | 8/1996 | Liang et al. | 437/44 |
| 5,547,884 | 8/1996 | Yamaguchi et al. | 437/43 |
| 5,554,550 | 9/1996 | Yang | 437/43 |
| 5,567,635 | 10/1996 | Acovic et al. | 437/43 |
| 5,571,738 | 11/1996 | Krivokapic | 437/44 |
| 5,587,331 | 12/1996 | Jun | 437/41 |
| 5,610,091 | 3/1997 | Cho | 437/43 |
| 5,736,435 | 4/1998 | Venkatesan et al. | 438/282 |

*Primary Examiner*—Charles Bowers
*Assistant Examiner*—David S. Blum
*Attorney, Agent, or Firm*—Skjerven, Morrill, MacPherson, Franklin & Friel LLP

[57] ABSTRACT

A method of forming an IGFET includes forming a trench in a substrate, forming spacers on opposing sidewalls of the trench, forming a gate insulator on a bottom surface of the trench between the spacers, forming a gate electrode on the gate insulator and the spacers, removing at least portions of the spacers to form voids in the trench after forming the gate electrode, implanting localized source and drain regions through the voids and through the bottom surface of the trench outside the gate electrode, and forming a source and drain in the substrate that include the localized source and drain regions adjacent to the bottom surface of the trench. The localized source and drain regions provide accurately positioned channel junctions beneath the trench. Furthermore, the dopant concentration of the localized source and drain regions is controlled by the amount of the spacers, if any, left intact when the localized source and drain regions are implanted after removing the portions of the spacers.

42 Claims, 7 Drawing Sheets

TRENCH TRANSISTOR WITH LOCALIZED SOURCE/DRAIN REGIONS IMPLANTED THROUGH VOIDS IN TRENCH

BACKGROUND OF THE INVENTION

1. Field of the Invention

The present invention relates to integrated circuits, and more particularly to insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and drain. The channel, source and drain are located in a semiconductor substrate, with the channel being doped oppositely to the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions.

Polysilicon (also called polycrystalline silicon, poly-Si or poly) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during introduction of the source and drain regions by ion implantation. The resistance of polysilicon can be further reduced by forming a silicide on its top surface.

There is a relentless trend to miniaturize semiconductor dimensions. The number of IGFETs that can be manufactured on an integrated circuit chip can be increased by decreasing the horizontal dimensions. Resolution refers to the horizontal linewidth or space that a lithographic system can adequately print or resolve. Lithographic systems include optical projection and step and repeat equipment, and electron beam lithography equipment. In optical systems, for instance, resolution is limited by the equipment (e.g., diffraction of light, lens aberrations, mechanical stability), optical properties of the photoresist (e.g., resolution, photosensitivity, index of refraction), and process characteristics (e.g., softbake step, develop step, postbake step, and etching step).

Furthermore, scaling down the horizontal dimensions generally requires a corresponding decrease in the vertical dimensions. As IGFET vertical dimensions are reduced and the supply voltage remains constant (e.g., 3V), the maximum lateral electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. Reducing the electric field on the order of 30–40% can reduce hot-electron-induced currents by several orders of magnitude. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however LDD structures are typically formed for both the source and drain to avoid the need for an additional masking step.

In the manufacture of integrated circuits, the planarization of semiconductor wafers is becoming increasingly important as the number of layers used to form integrated circuits increases. For instance, the gate electrode and/or metallization layers formed to provide interconnects between various devices may result in nonuniform surfaces. The surface nonuniformities may interfere with the optical resolution of subsequent lithographic steps, leading to difficulty with printing high resolution patterns. The surface nonuniformities may also interfere with step coverage of subsequently deposited metal layers and possibly cause open circuits.

Accordingly, a need exists for an IGFET that can be manufactured with reduced horizontal dimensions, that preferably includes an LDD as well as a substantially planar top surface. It is especially desirable that the IGFET have a channel length that can be significantly smaller than the minimum resolution of the available lithographic system.

SUMMARY OF THE INVENTION

The present invention provides an insulated-gate field-effect transistor (IGFET) with a gate electrode in a trench (i.e., a trench transistor) and localized source and drain regions adjacent to a bottom surface of the trench. A gate insulator is disposed on the bottom surface of the trench, and the gate electrode in the trench is disposed on the gate insulator. Preferably, the localized source and drain regions define a channel beneath the trench that is substantially aligned with the bottom surface of the gate electrode. If the trench length corresponds to the minimum resolution of a lithographic system, then the channel length is significantly smaller than the minimum resolution. Furthermore, the gate electrode is substantially aligned with the top surface of the substrate, and substantially all of the gate electrode is within the trench. In this manner, a highly miniaturized IGFET can be produced.

A key feature of the invention is the formation of spacers in the trench, the formation of the gate electrode on the spacers, the removal of some or all of the spacers to form voids in the trench, and the implantation of localized source and drain regions through the voids and through outer portions of the bottom surface of the trench outside the gate electrode. The spacers are used to separate the gate electrode from opposing sidewalls of the trench, and then are partially or completely removed to allow implantation of the localized source/drain regions beneath the trench.

According to one aspect of the invention, a method of forming an IGFET includes forming a trench in a substrate, forming spacers on opposing sidewalls of the trench, forming a gate insulator on a bottom surface of the trench, forming a gate electrode on the gate insulator and the spacers, removing at least portions of the spacers within the trench after forming the gate electrode, implanting localized source and drain regions through the bottom surface of the trench into the substrate outside the gate electrode after removing the portions of the spacers, and forming a source and drain in the substrate wherein the source includes the localized source region and the drain includes the localized drain region.

Preferably, the source and drain include sidewall source and drain regions adjacent to the sidewalls of the trench and extending between the top surface of the substrate and the bottom surface of the trench. The sidewall source and drain regions can be implanted before, simultaneously with, or both during and after implanting the localized source and drain regions. Likewise, the sidewall source and drain regions can be implanted before or after the trench is formed, and to a greater or lesser depth than the trench. It is also preferred that the localized source and drain regions are lightly doped, and the sidewall source and drain regions are heavily doped, to provide an LDD structure. The localized source and drain regions can define channel junctions that are substantially aligned with the bottom surface of the gate electrode. The gate electrode can be formed by depositing a blanket layer of gate electrode material over the substrate, and then polishing the gate electrode material until the gate electrode is substantially aligned with a planar top surface of the substrate. As exemplary materials, the gate electrode is polysilicon, the gate insulator is silicon dioxide, and the spacers are silicon dioxide.

A first embodiment of the method includes providing a P-type substrate, implanting an N+ doped layer into the substrate using a heavy dose of ions, patterning a photoresist layer over the substrate, etching a trench defined by an opening in the photoresist layer completely through the doped layer and partially through the substrate thereby splitting the doped layer into N+ sidewall source and drain regions, stripping the photoresist layer, forming oxide spacers on opposing sidewalls of the trench, growing a gate oxide on a central portion of the bottom surface of the trench between the oxide spacers, depositing a polysilicon layer over the substrate, polishing the polysilicon layer to form a polysilicon gate electrode within the trench and substantially aligned with the top surface of the substrate, removing the oxide spacers to form voids in the trench, implanting N– localized source and drain regions through the voids and through outer portions of the bottom surface of the trench using a light dose of ions with the polysilicon gate electrode as an implant mask, and applying a high-temperature anneal to form the source and drain by activating and merging the localized and sidewall source and drain regions.

A second embodiment of the method includes providing a P-type substrate, patterning a photoresist layer over the substrate, etching a trench defined by an opening in the photoresist layer partially through the substrate, stripping the photoresist layer, forming oxide spacers on opposing sidewalls of the trench, growing a gate oxide on a central portion of the bottom surface of the trench between the oxide spacers, depositing a polysilicon layer over the substrate, polishing the polysilicon layer to form a polysilicon gate electrode within the trench and substantially aligned with the top surface of the substrate, partially removing the oxide spacers to form voids in the trench, simultaneously implanting N+ sidewall source and drain regions outside the trench and N– localized source and drain regions through the voids and through outer portions of the bottom surface of the trench using a heavy dose of ions with the polysilicon gate electrode as an implant mask and with portions of the spacers left intact as a partial implant mask that allows passage of some but not all of the ions impinging thereon into the substrate, and applying a high-temperature anneal to form the source and drain by activating and merging the localized and sidewall source and drain regions.

A primary advantage of the invention is that the IGFET can have a channel length that is significantly smaller than the minimum resolution of the available lithographic system, thereby providing a next generation transistor with the present generation lithography. In addition, the gate electrode is substantially aligned with the top surface of the substrate. Furthermore, the localized source and drain regions provide accurately positioned channel junctions, and the dopant concentration of the localized source and drain regions can be controlled by the amount of the spacers, if any, left intact when the localized source and drain regions are implanted after the portions of the spacers are removed.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
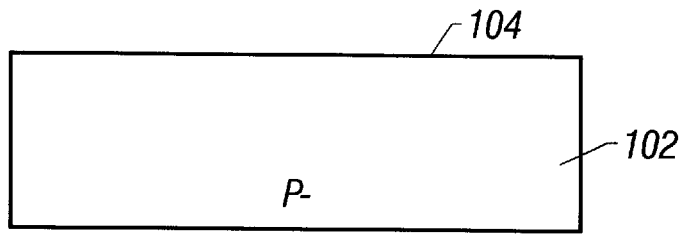
FIGS. 1A–1M show cross-sectional views of successive process steps for forming an IGFET with a gate electrode in a trench and localized source and drain regions beneath the trench in accordance with a first embodiment of the invention.

In the drawings, depicted elements are not necessarily drawn to scale and like or similar elements may be designated by the same reference numeral throughout the several views.

FIGS. 1A–1M show cross-sectional views of successive process steps for forming an IGFET with a gate electrode in a trench and localized source and drain regions beneath the trench in accordance with a first embodiment of the invention.

In FIG. 1A, semiconductor substrate 102 suitable for integrated circuit manufacture is provided. Substrate 102 includes a P– epitaxial surface layer with a <100> orientation, a boron concentration of $1 \times 10^{15}$ atoms/cm$^3$ and a resistivity of 12 ohm-cm. Preferably, the epitaxial surface layer is disposed on a P+ base layer (not shown). The epitaxial surface layer has a planar top surface 104.

Figure 1B:
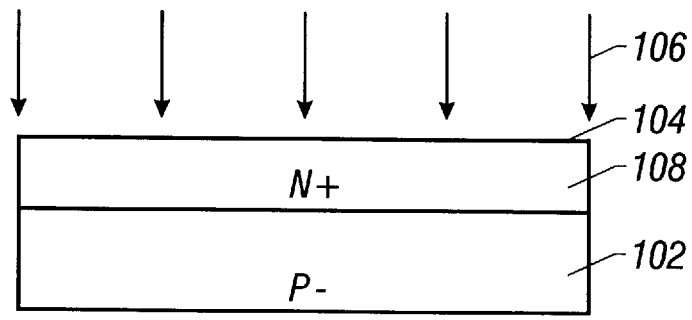

In FIG. 1B, substrate 102 is subjected to ion implantation of arsenic, indicated by arrows 106, at a heavy dosage in the range of $1 \times 10^{15}$ to $5 \times 10^{15}$ atoms/cm$^2$ and an energy in the range of 2 to 80 kiloelectron-volts. This forms N+ doped layer 108 with an arsenic concentration in the range of $1 \times 10^{20}$ to $1 \times 10^{21}$ atoms/cm$^3$ and a depth of 1800 angstroms beneath top surface 104.

Figure 1C:
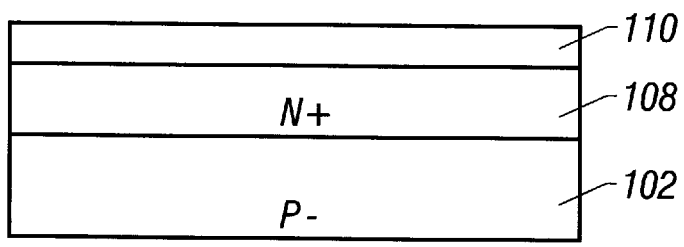

In FIG. 1C, a blanket layer of silicon dioxide (SiO$_2$) is deposited by chemical vapor deposition to form oxide layer 110 on substrate 102. Oxide layer 110 has a thickness of 200 angstroms.

Figure 1D:
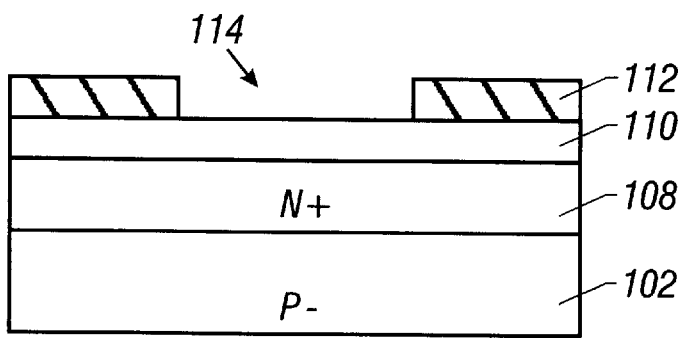

In FIG. 1D, photoresist layer 112 is deposited as a continuous layer on oxide layer 110 and then selectively irradiated using a photolithographic system, such as a step and repeat optical projection system, in which I-line ultra-violet light from a mercury-vapor lamp is projected through a reticle and a focusing lens to project the desired image pattern on photoresist layer 112. Thereafter, photoresist layer 112 is developed and the irradiated portions are removed to provide opening 114 that defines the lateral boundaries for a trench. The minimum resolution (i.e. linewidth and spacing) of the step and repeat system is 4000 angstroms (0.4 microns). Therefore, to reduce feature sizes, the length of opening 114 is 4000 angstroms.

Figure 1E:
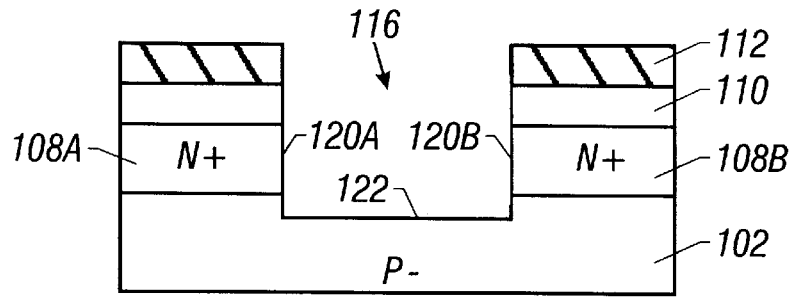

In FIG. 1E, an anisotropic etch provided by a reactive ion etch is applied using photoresist layer 112 as an etch mask. The etch completely removes the portion of oxide layer 110 exposed by opening 114. The etch also removes an upper portion of substrate 102 beneath opening 114 to form trench 116 completely through doped layer 108 and partially through substrate 102. Trench 116 includes opposing vertical sidewalls 120A and 120B, and planar bottom surface 122. Trench 116 has a depth (or height) of 2000 angstroms between top surface 104 and bottom surface 122, and a length of 4000 angstroms between sidewalls 120A and 120B. Trench 116 extends 200 angstroms beneath doped layer 108 and splits doped layer 108 into sidewall source region 108A and sidewall drain region 108B. Sidewall source region 108A is adjacent to sidewall 120A, and sidewall source region 108B is adjacent to sidewall 120B, however sidewall source region 108A and sidewall drain region 108B are spaced from bottom surface 122.

Figure 1F:
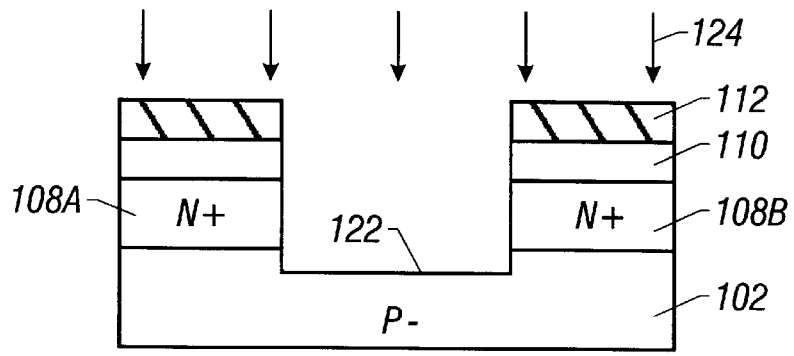

In FIG. 1F, a channel implant provided by boron, as indicated by arrows 124, is implanted through bottom surface 122 using photoresist layer 112 as an implant mask. The channel implant includes a well implant, then a punch-through implant, and then a threshold voltage implant. The well implant provides a more uniform background doping, the punchthrough implant provides the channel with greater robustness to punchthrough voltages, and the threshold voltage implant sets the threshold voltage of the IGFET to approximately 0.4 to 0.7 volts. The well implant is provided by boron at a dose in the range of $1 \times 10^{12}$ to $1 \times 10^{13}$ atoms/cm$^2$ and an energy in the range of 100 to 170 kiloelectron-volts, the punchthrough implant is provided by boron at a dose in the range of $1 \times 10^{12}$ to $1 \times 10^{13}$ atoms/cm$^2$ and an energy in the range of 40 to 100 kiloelectron-volts, and the threshold voltage implant is provided by boron at a dose in the range of $1 \times 10^{12}$ to $1 \times 10^{13}$ atoms/cm$^2$ and an energy in the range of 2 to 30 kiloelectron-volts. The channel implant has a boron concentration on the order of $1 \times 10^{17}$ atoms/cm$^3$ and provides suitable doping for a channel adjacent to bottom surface 122.

Figure 1G:
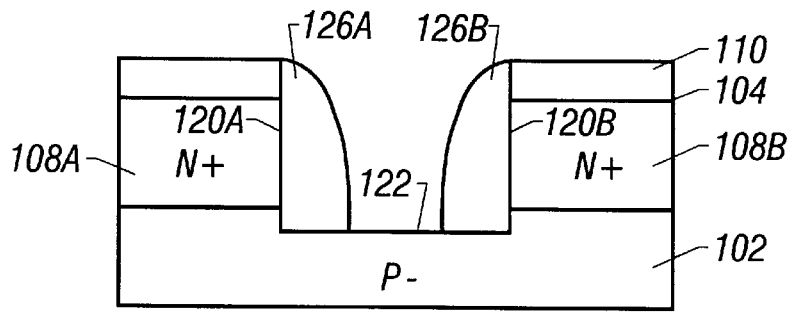

In FIG. 1G, photoresist layer 112 is stripped, a blanket layer of silicon dioxide that is 2500 angstroms thick is conformally deposited over substrate 102, and then an anisotropic etch provided by a reactive ion etch is applied to form oxide spacers 126A and 126B in trench 116. The spacer etch is timed to remove the blanket layer of silicon dioxide over oxide layer 110 while removing about 100 angstroms of oxide layer 110. Oxide spacers 126A and 126B contact and completely cover sidewalls 120A and 120B, respectively, and extend to the top surface of oxide layer 110. Oxide spacers 126A and 126B also contact and cover outer portions of bottom surface 122 adjacent to sidewalls 120A and 120B, but leave exposed a central portion of bottom surface 122 between and adjacent to the outer portions. Oxide spacers 126A and 126B each have a length of 1200 angstroms along the outer portions of bottom surface 122. Therefore, the central portion of bottom surface 122 has a length of 1600 angstroms (4000–2400 angstroms), and is spaced from sidewalls 120A and 120B by 1200 angstroms. The central portion of bottom surface 122 will be substantially aligned with a channel between localized source/drain regions, as further described below.

The spacer dimensions depend on several factors, including the height and length of the trench, the thickness of the oxide layer on the top surface of the substrate, the thickness of the conformal spacer oxide layer, and the duration of the spacer etch. The spacer dimensions are selected to provide the desired scaling of the trench length to the channel length. However, the channel length depends on other factors including the characteristics of subsequent localized source and drain regions and a high-temperature anneal. Preferably, the channel length is scaled to less than half of the trench length, and is less than 2000 angstroms.

Figure 1H:
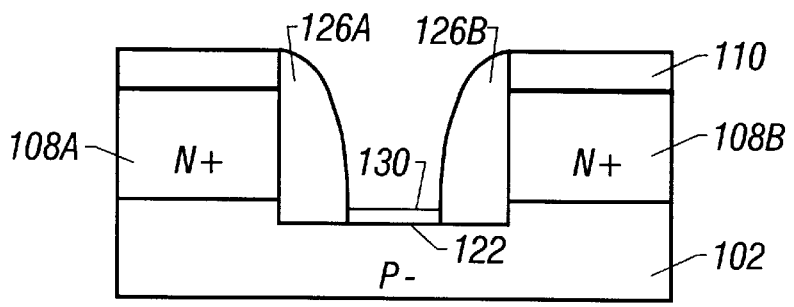

In FIG. 1H, a high quality layer of silicon dioxide is thermally grown on the exposed silicon surfaces using tube growth at a temperature of 700 to 1000° C. in an O$_2$ containing ambient. As a result, gate oxide 130 with a thickness of 50 angstroms is formed on the central portion of bottom surface 122, and the heights of oxide layer 110 and oxide spacers 126A and 126B increase.

Figure 1I:
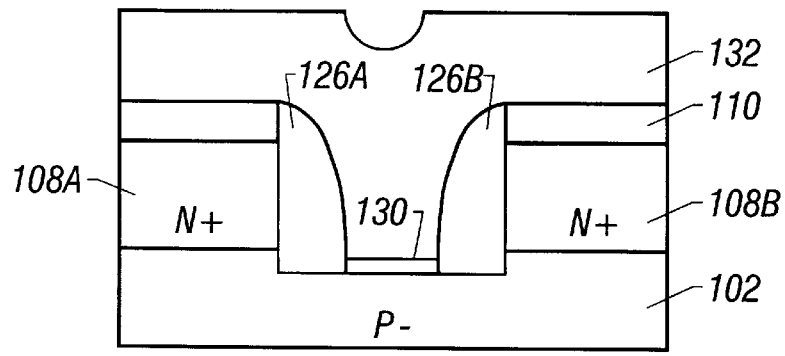

In FIG. 1I, a blanket layer of undoped polysilicon 132 with a thickness of 4000 angstroms is deposited by low pressure chemical vapor deposition over substrate 102. Thus, polysilicon 132 is deposited on oxide spacers 126A and 126B, on gate oxide 130, and on oxide layer 110. Polysilicon 132 fills the remaining space in trench 116. Thereafter, polysilicon 132 is doped by subjecting the structure to ion implantation of arsenic at a heavy dose in the range of $1 \times 10^{15}$ to $5 \times 10^{15}$ atoms/cm$^2$ and an energy in the range of 2 to 80 kiloelectron-volts. Polysilicon 132 is thick enough to prevent the arsenic ions from passing through to the underlying structure.

Figure 1J:
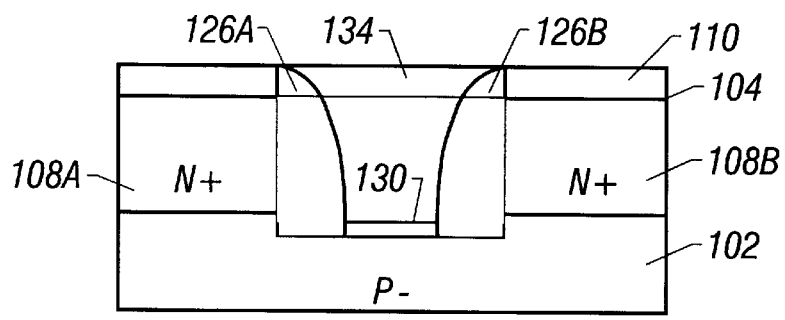

In FIG. 1J, the structure is planarized by applying chemical-mechanical polishing in the presence of an abrasive slurry that is highly selective of polysilicon with respect to silicon dioxide. The polishing grinds down polysilicon 132 along with oxide layer 110 and oxide spacers 126A and 126B above top surface 104, and is discontinued using oxide layer 110 and oxide spacers 126A and 126B as a stop-layer. The remaining portion of polysilicon 132 forms polysilicon gate electrode 134. As is seen, the top surfaces of oxide layer 110, oxide spacers 126A and 126B, and polysilicon gate electrode 134 are aligned and form a planar surface. Polysilicon gate electrode 134 extends merely 50 angstroms above top surface 104, and therefore is substantially aligned with top surface 104. All of polysilicon gate 134 is within the length of trench 116, and substantially all of polysilicon gate electrode 134 is within trench 116. Of importance, polysilicon gate electrode 134 is spaced from substrate 102 by oxide spacers 126A and 126B and gate oxide 130. No portion of polysilicon gate electrode 134 contacts substrate 102 or overlaps top surface 104.

Figure 1K:
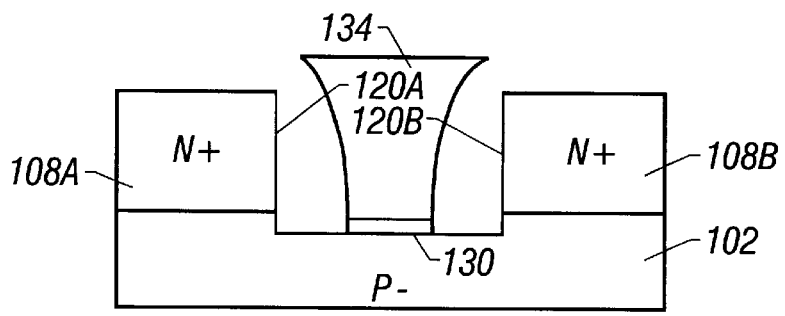

In FIG. 1K, a wet etch that is highly selective of silicon dioxide is applied to completely remove oxide layer 110 and oxide spacers 126A and 126B without attacking polysilicon gate electrode 134 or substrate 102. The wet etch also undercuts a slight amount of gate oxide 104 beneath the bottom surface of polysilicon gate electrode 134. The removal of oxide spacers 126A and 126B creates voids in trench 116 that expose the outer portions of bottom surface 122. In particular, the outer portions of bottom surface 122 each extend about 1000 angstroms outside the top surface of polysilicon gate electrode 134, and about 200 angstroms beneath the top surface and outside the bottom surface of polysilicon gate electrode 134.

Figure 1L:
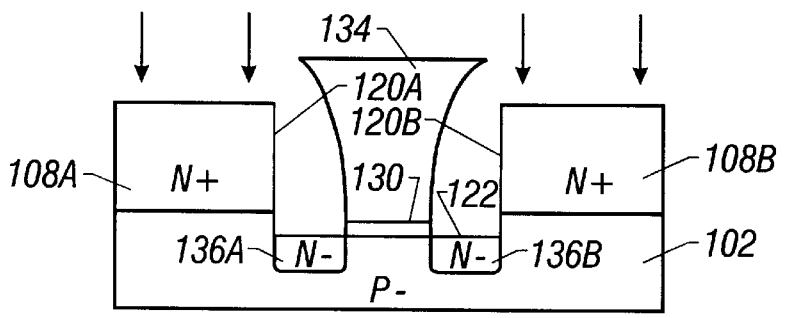

In FIG. 1L, substrate 102 is subjected to ion implantation of arsenic, indicated by arrows 136, at a light dosage in the range of $1\times10^{13}$ to $5\times10^{14}$ atoms/cm$^2$ and an energy in the range of 2 to 80 kiloelectron-volts. The implant has little effect on sidewall source region 108A and sidewall drain region 108B, which are already doped N+. Polysilicon gate electrode 134 provides an implant mask for the central portion of bottom surface 122. However, the arsenic ions are implanted through the voids in trench 116 and directly through the exposed outer portions of bottom surface 122 outside polysilicon gate electrode 134 to form localized source region 136A and localized drain region 136B in substrate 102. Localized source region 136A and localized drain region 136B are adjacent to the outer portions of bottom surface 122, extend to sidewalls 120A and 120B, respectively, and are slightly outside gate oxide 130 (and thus the bottom surface of polysilicon gate electrode 134). Localized source region 136A and localized drain region 136B are doped N− with an arsenic concentration in the range of $5\times10^{17}$ to $5\times10^{18}$ atoms/cm$^3$ a depth of 1000 angstroms beneath bottom surface 122.

Figure 1M:
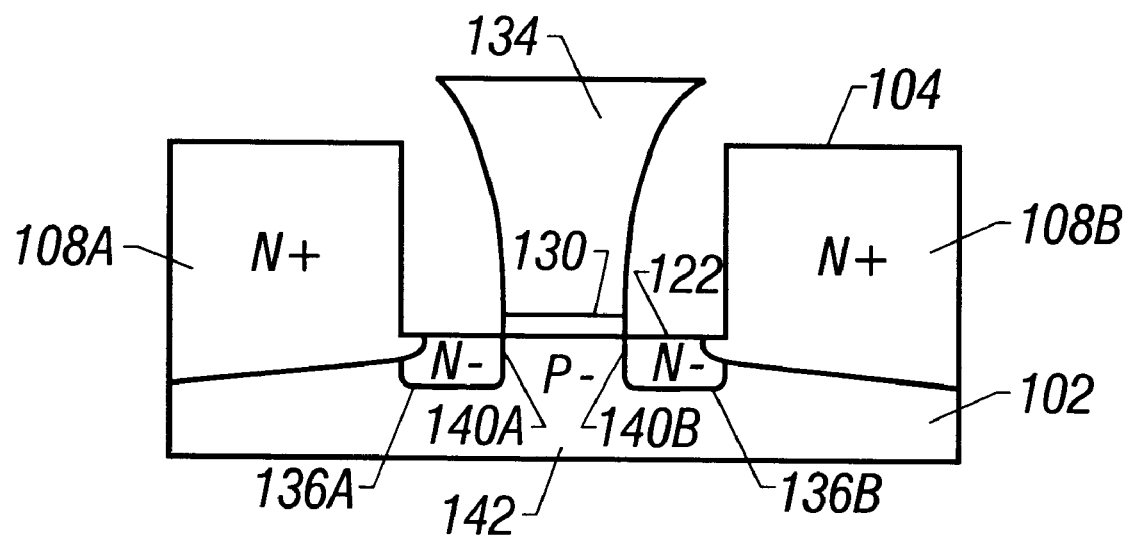

In FIG. 1M, a rapid thermal anneal on the order of 950 to 1050° C. for 10 to 30 seconds is applied to remove crystalline damage and to activate and drive-in the implanted dopants. The implated arsenic diffuses into substrate 102 both laterally and vertically. In particular, sidewall source region 108A and sidewall drain region 108B diffuse slightly beneath bottom surface 122. As a result, source regions 108A and 136A merge to form a source, and drain regions 108B and 136B merge to form a drain. Accordingly, localized drain region 136B provides for a lightly doped drain. Furthermore, localized source region 108A and localized drain region 108B laterally diffuse to provide channel junctions 140A and 140B, respectively, Channel junctions 140A and 140B define channel 142 that is substantially aligned with and adjacent to the central portion of bottom surface 122. Therefore, channel 142 is substantially aligned with and adjacent to gate oxide 130, and is substantially aligned with and spaced from the bottom surface of polysilicon gate electrode 134. Channel 142 has a channel length of approximately 1600 angstroms. Sidewall source region 108A and sidewall drain region 108B extend to top surface 104 for receiving source/draina contacts. Accordingly, polysilicon gate electrode 134 controls an N-channel MOSFET with channel 142 between the source and drain.

FIG. 2A–2L show cross-sectional views of successive process steps for forming an IGFET with a gate electrode in a trench and localized source and drain regions beneath the trench in accordance with a second embodiment of the invention. In the first embodiment, three separate implant steps were used to dope the doped layer containing the sidewall source and drain regions, the polysilicon gate electrode, and the localized source and drain regions. Combining these three implants into a single implant step is desirable from an efficiency standpoint, particularly if the implantation provides lightly doped localized source and drain regions and heavily doped sidewall source and drain regions. The primary difference between the second embodiment and the first embodiment is that in the second embodiment, the sidewall source and drain regions are implanted at the same time the localized source and drain regions are implanted, and lower portions of the spacers left intact in the trench block some but not all of the ions impinging thereon from reaching the outer portions of the bottom surface of the trench. Accordingly, by implanting with a heavy dose, the sidewall source and drain regions (being fully exposed) are heavily doped whereas the localized source and drain regions (being partially masked) are lightly doped. Unless otherwise noted, the elements for the second embodiment (e.g., substrate 202, gate oxide 230, etc.) are similar to elements of the first embodiment (e.g., substrate 102, gate oxide 130, etc.), and the description of related elements and process steps need not be repeated.

Figure 2A:
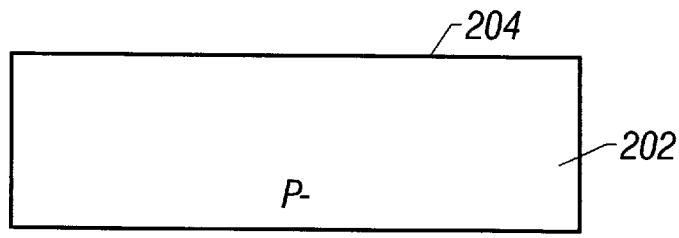
FIGS. 2A–2L show cross-sectional views of successive process steps for forming an IGFET with a gate electrode in a trench and localized source and drain regions beneath the trench in accordance with a second embodiment of the invention.

In FIG. 2A, semiconductor substrate 202 suitable for integrated circuit manufacture is provided. Substrate 202 includes a P− epitaxial surface layer with a boron concentration of $1\times10^{15}$ atoms/cm$^3$ and planar top surface 204.

Figure 2B:
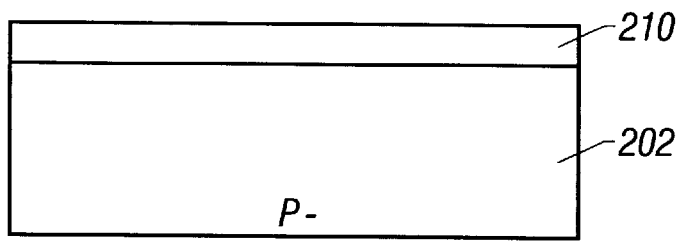

In FIG. 2B, a blanket layer of silicon dioxide is deposited by chemical vapor deposition to form oxide layer 210 on substrate 202. Oxide layer 210 has a thickness of 200 angstroms.

Figure 2C:
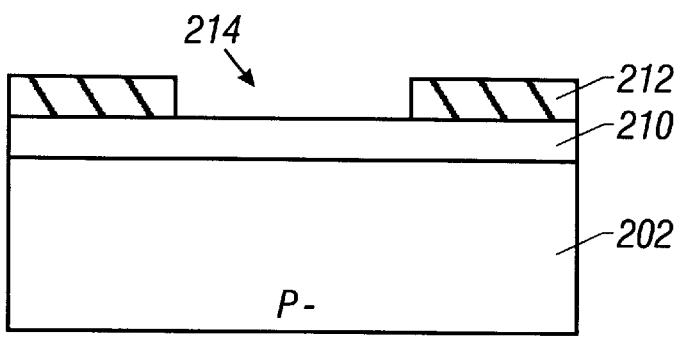

In FIG. 2C, photoresist layer 212 is deposited as a continuous layer on oxide layer 210 and then selectively irradiated using a step and repeat system. Thereafter, photoresist layer 212 is developed and the irradiated portions are removed to provide opening 214 that defines the lateral boundaries for a trench. The length of opening 214 is 4000 angstroms.

Figure 2D:
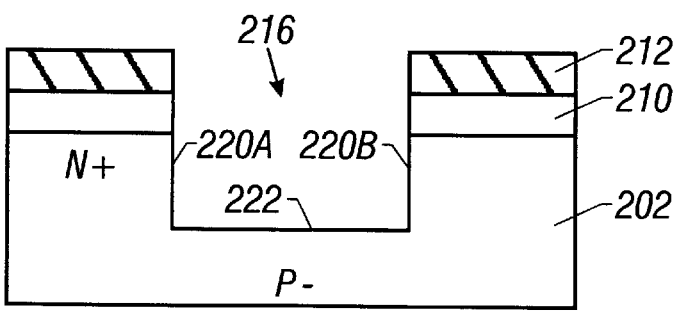

In FIG. 2D, an anisotropic etch is applied using photoresist layer 212 as an etch mask. The trench etch completely removes the portion of oxide layer 210 exposed by opening 214 and forms trench 216 partially through substrate 202. Trench 216 includes opposing vertical sidewalls 220A and 220B, and planar bottom surface 222. Trench 216 has a depth (or height) of 2000 angstroms between top surface 204 and bottom surface 222, and a length of 4000 angstroms between sidewalls 220A and 220B.

Figure 2E:
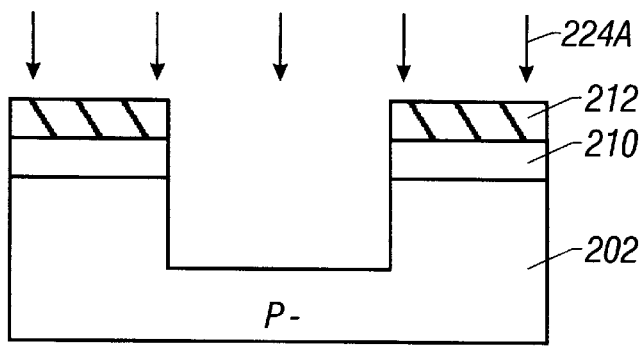

In FIG. 2E, a channel implant provided by boron, as indicated by arrows 224, is implanted through bottom surface 222 using photoresist layer 212 as an implant mask. The channel implant includes a well implant, then a punch-through implant, and then a threshold voltage implant. The channel implant has a boron concentration on the order of $1\times10^{17}$ atoms/cm$^3$ and provides suitable doping for a channel adjacent to bottom surface 222.

Figure 2F:
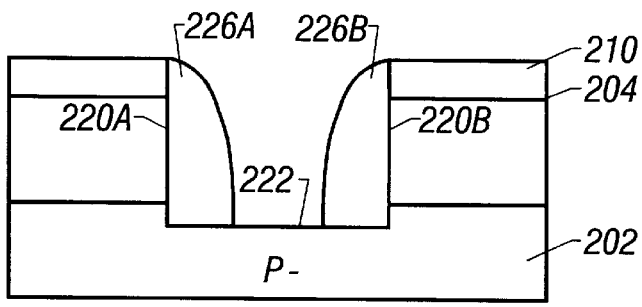

In FIG. 2F, photoresist layer 212 is stripped, a blanket layer of silicon dioxide that is 2500 angstroms thick is conformally deposited over substrate 202, and then an anisotropic etch is applied to form oxide spacers 226A and 226B adjacent to sidewalls 220A and 220B, respectively. Oxide spacers 226A and 226B cover outer portions of bottom surface 222 while exposing a central portion of bottom surface 222. Oxide spacers 226A and 226B each have a length of 1200 angstroms along bottom surface 222.

Figure 2G:
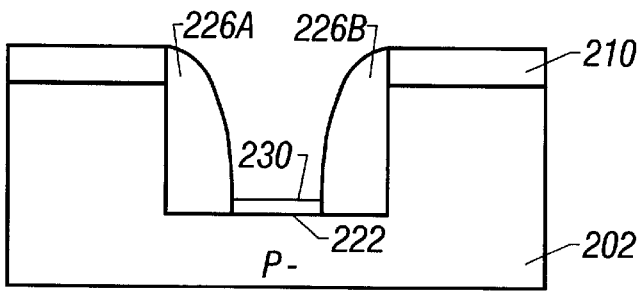

In FIG. 2G, gate oxide 230 with a thickness of 50 angstroms is thermally grown on the central portion of bottom surface 222.

Figure 2H:
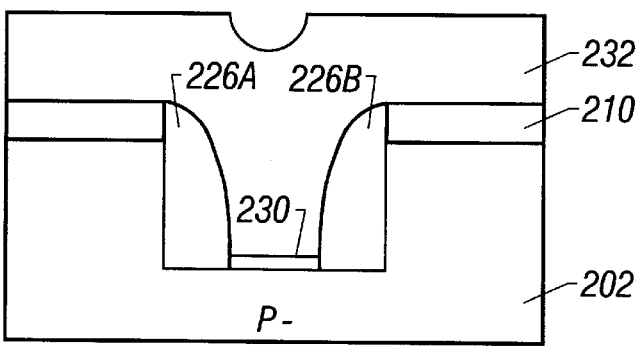

In FIG. 2H, a blanket layer of undoped polysilicon 232 with a thickness of 4000 angstroms is deposited by low pressure chemical vapor deposition over substrate 202. Polysilicon 232 contacts oxide layer 210, oxide spacers 226A and 226B and gate oxide 230 and fills the remaining space in trench 216.

Figure 2I:
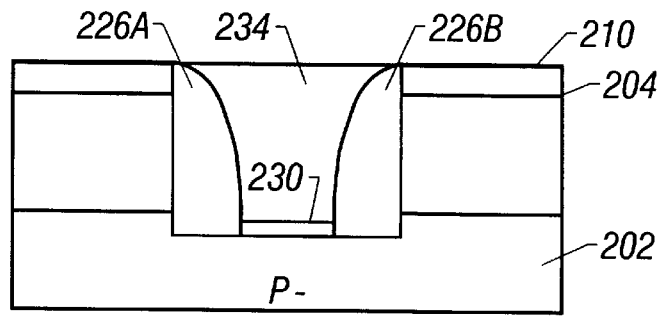

In FIG. 2I, the structure is planarized by applying chemical-mechanical polishing in the presence of an abrasive slurry that is highly selective of polysilicon with respect to silicon dioxide. The polishing grinds down regions of polysilicon 232, oxide layer 210 and oxide spacers 226A and 226B but is discontinued before reaching top surface 204. The remaining portion of polysilicon 232 forms polysilicon gate electrode 234, which is aligned with oxide layer 210 and oxide spacer 226A and 226B. Polysilicon gate electrode 234, which extends merely 50 angstroms above top surface 204, is substantially aligned with top surface 204. Substantially all of polysilicon gate electrode 234 is within trench 216.

Figure 2J:
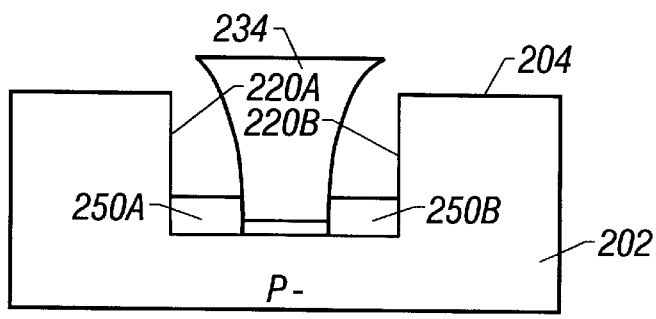

In FIG. 2J, a wet etch that is highly selective of silicon dioxide is applied to partially remove oxide spacers 226A and 226B without attacking polysilicon gate electrode 234 or substrate 202. The wet etch removes oxide layer 210. The wet etch also removes upper portions of oxide spacers 226A and 226B, creating voids extending partially through trench 216, but leaves intact the lower 500 angstroms of oxide spacers 226A and 226B, shown as lower oxide spacer portions 250A and 250B, respectively. Preferably, the wet etch provides a precisely controlled oxide removal rate to accurately control the heights of lower oxide spacer portions 250A and 250B.

Figure 2K:
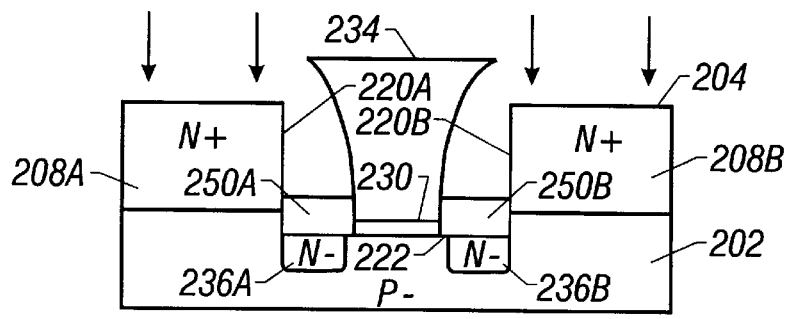

In FIG. 2K, substrate 202 is subjected to ion implantation of arsenic, indicated by arrows 206, at a heavy dosage in the range of $1\times10^{15}$ to $5\times10^{15}$ atoms/cm$^2$ and an energy in the range of 2 to 80 kiloelectron-volts. The arsenic implant introduces sidewall source region 208A and sidewall drain region 208B into substrate 202, adjacent to top surface 204, adjacent to sidewalls 220A and 220B, respectively, and spaced from bottom surface 222. Sidewall source region 208A and sidewall drain region 208B are doped N+ with an arsenic concentration in the range of $1\times10^{20}$ to $1\times10^{21}$ atoms/cm$^3$ and a depth of 1800 angstroms beneath top surface 204. The arsenic implant also introduces localized source region 236A and localized drain region 236B into substrate 202, adjacent to the outer portions of bottom surface 222, adjacent to sidewalls 220A and 220B, respectively, spaced from sidewall source and drain regions 208A and 208B, respectively, and spaced slightly from gate oxide 230. Localized source region 236A and localized drain region 236B are doped N– with an arsenic concentration in the range of $5\times10^{17}$ to $5\times10^{18}$ atoms/cm$^3$ and a depth of 1000 angstroms beneath bottom surface 222. During the implantation, polysilicon gate electrode 234 provides an implant mask for the central portion of bottom surface 222, whereas, for arsenic ions passing through the voids in trench 216, lower oxide spacer portions 250A and 250B provide a partial implant mask for the outer portions of bottom surface 222. That is, lower oxide spacer portions 250A and 250B block a substantial amount of the arsenic ions impinging thereon from reaching substrate 202, but also allow a substantial amount of the arsenic ions impinging thereon to pass into substrate 202. In this manner, lower oxide spacer portions 250A and 250B control the doping concentration of localized source region 236A and localized drain region 236B by permitting passage of some but not all of the arsenic ions impinging thereon into the underlying portions of substrate 202.

Figure 2L:
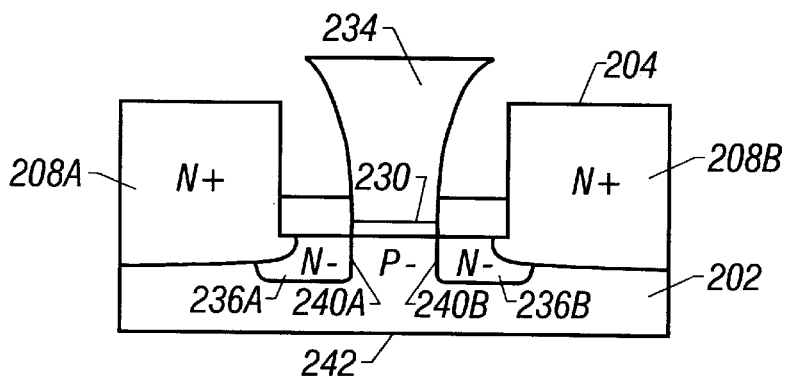

In FIG. 2L, a rapid thermal anneal on the order of 950 to 1050° C. for 10 to 30 seconds is applied to remove crystalline damage and to activate and drive-in the implanted dopants. As a result, source regions 208A and 236A merge to form a source, and drain regions 208B and 236B merge to form a drain. Accordingly, localized drain region 236B provides for a lightly doped drain Furthermore, channel junctions 240A and 240B define channel 242 that is substantially aligned with and adjacent to the central portion of bottom surface 222, substantially aligned with and adjacent to gate oxide 230, and substantially aligned with and spaced from the bottom surface of polysilicon gate electrode 234. Channel 242 has a length of approximately 1600 angstroms. Sidewall source region 208A and sidewall drain region 208B extend to top surface 204 for receiving source/drain contacts. Accordingly, polysilicon gate electrode 234 controls an N-channel MOSFET with channel 242 between the source and drain After the spacers are removed (partially or entirely) and the localized source and drain regions are implanted, the voids in the trench (formerly occupied by the removed portions of the spacers) are subsequently partially or entirely filled. For instance, the voids can be completely filled by depositing an interlayer dielectric such as silicon dioxide over the substrate. Alternatively, the voids can be partially filled by a growing a thermal oxide which bridges upper portions of the voids and seals air gaps in lower portions of the voids.

As yet another embodiment, heavily doped sidewall source and drain regions can be implanted after implanting lightly doped localized source and drain regions. For instance, as variation to the first embodiment, a method which omits the doped layer includes implanting lightly doped localized source and drain regions thereby implanting lightly doped sidewall source and drain regions, completely filling the voids with a material such as silicon dioxide, and then subjecting the structure to a heavy dose of arsenic to provide heavy doping for the sidewall source and drain regions (and, if desired, the polysilicon gate electrode) such that the entire bottom surface of the trench is isolated from the heavy dose by the polysilicon gate electrode and the material in the voids.

Further processing steps in the fabrication of IGFETs typically include forming a thick oxide layer over the active regions, forming contact windows in the oxide layer above the source, drain and gate electrode, forming appropriate interconnect metallization in the contact windows, and then forming a passivation layer. In addition, either earlier or subsequent high-temperature process steps can be used to supplement or replace the high-temperature anneal to provide the desired anneal, activation, and diffusion for the implanted dopants. These further processing steps are conventional and need not be repeated herein. Likewise the principal processing steps disclosed herein may be combined with other steps readily apparent to those skilled in the art.

At completion of the process, it is preferred that the channel length be precisely controlled. However, to the extent that the lateral locations of the channel junctions are not (or can not be) precisely controlled, it is far preferable to have a slight overlap between the channel junctions and the bottom surface of the gate electrode as opposed to a lateral displacement or gap. While a slight overlap leads to capacitive effects (known as "Miller capacitance") that tend to reduce switching speeds, a lateral displacement or gap may prevent formation of a conductive channel between the source and the drain during operation. Furthermore, decreasing the channel length increases the drive current. Therefore, the overlap between the gate electrode and the source/drain involves a tradeoff between switching speed and drive current.

The present invention includes numerous variations to the embodiments described above. For instance, a nitride layer can be deposited over the oxide layer before forming the trench. The sidewall source and drain regions can be implanted to a greater depth than the trench to facilitate merging the localized and sidewall source and drain regions. If desired, the localized source and drain regions can be heavily doped. The gate electrode can be various conductors such as aluminum, titanium, tungsten, cobalt, and combinations thereof, although the material may be limited by the use of subsequent high-temperature steps. The gate insulator can be various dielectrics. Likewise, the spacers can be various materials, including nitrides, oxynitrides, and metals. For instance, aluminum spacers can be removed with standard photoresist stripping solutions (such as $H_2SO_4$ diluted with $H_2O$) that do not attack the underlying structure. The spacers can be removed with an isotropic plasma etch. Similarly, by applying an anisotropic etch, regions of the spacers beneath the top surface and outside the bottom surface of the gate electrode can be left intact. The composition of the spacers and the amount of the spacers removed can be adjusted to accommodate the desired dopant concentration in the localized source and drain regions. For instance, removing the upper 50% of the spacers while leaving intact the lower 50% will block far more ions and result in a far lower doping concentration than removing the upper 90% of the spacers and leaving intact the lower 10%. If desired, the spacers can be completely removed, and then secondary oxide spacers can be grown on the outer portions of the bottom surface before implanting the localized source and drain regions through the secondary oxide spacers. The spacers can be deposited in various manners, including decomposition of silane and decomposition of tetraethyl orthosilicate (TEOS). Suitable N-type dopants include arsenic and phosphorus; suitable P-type dopants include boron $B_{10}$, boron $B_{11}$, and $BF_X$ species such as $BF_2$.

Further details regarding trench transistors are disclosed in U.S. application serial no. [unassigned, attorney docket no. M-3996 US] filed concurrently herewith, entitled "Trench Transistor With Metal Spacers" by Gardner et al.; U.S. application serial no. [unassigned, attorney docket no. M-3998 US] filed concurrently herewith, entitled "Trench Transistor With Insulative Spacers" by Gardner et al.; U.S. application serial no. [unassigned, attorney docket no. M-4074 US] filed concurrently herewith, entitled "Trench Transistor With Localized Source/Drain Regions Implanted Through Selectively Grown Oxide Layer" by Gardner et al.; U.S. application serial no. [unassigned, attorney docket no. M-4120 US] filed concurrently herewith, entitled "Trench Transistor In Combination With Trench Array" by Fulford, Jr. et al.; U.S. application serial no. [unassigned, attorney docket no. M-4214 US] filed concurrently herewith, entitled "Trench Transistor And Isolation Trench" by Gardner et al.; and U.S. application serial no. [unassigned, attorney docket no. M-4218 US] filed concurrently herewith, entitled "Trench Transistor With Source Contact In Trench" by Gardner et al.; the disclosures of which are incorporated herein by reference.

The invention is particularly well-suited for fabricating N-channel MOSFETs, P-channel MOSFETs, and other types of IGFETs, particularly for high-performance microprocessors where high circuit density is essential. Although only a single IGFET has been shown for purposes of illustration, it is understood that in actual practice, many devices are fabricated on a single semiconductor wafer as widely practiced in the art. Accordingly, the invention is well-suited for use in integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming an IGFET, comprising the steps of:

forming a trench in a substrate;

forming spacers on opposing sidewalls of the trench;

forming a gate insulator on a bottom surface of the trench;

forming a gate electrode on the gate insulator and the spacers;

removing at least portions of the spacers within the trench after forming the gate electrode;

implanting localized source and drain regions through the bottom surface of the trench into the substrate outside the gate electrode after removing the portions of the spacers; and forming a source and a drain in the substrate, wherein the source includes the localized source region adjacent to the bottom surface of the trench and the drain includes the localized drain region adjacent to the bottom surface of the trench.

2. The method of claim 1, including forming the gate insulator after forming the spacers.

3. The method of claim 1, wherein forming the drain and the source includes implanting sidewall source and drain regions through a top surface of the substrate into portions of the substrate, such that the sidewall source and drain regions are adjacent to the sidewalls of the trench.

4. The method of claim 3, including implanting the sidewall source and drain regions and the localized source and drain regions simultaneously.

5. The method of claim 3, including implanting the sidewall source and drain regions before implanting the localized source and drain regions.

6. The method of claim 3, including implanting the sidewall source and drain regions both during and after implanting the localized source and drain regions.

7. The method of claim 3, including forming the trench before implanting the sidewall source and drain regions.

8. The method of claim 3, including forming the trench after implanting the sidewall source and drain regions.

9. The method of claim 3, including implanting the sidewall source and drain regions to a smaller depth than the trench.

10. The method of claim 3, including implanting the sidewall source and drain regions to a greater depth than the trench.

11. The method of claim 3, wherein the sidewall source and drain regions are heavily doped regions.

12. The method of claim 11, wherein the localized source and drain regions are lightly doped regions.

13. The method of claim 11, wherein the localized source and drain regions are heavily doped regions.

14. The method of claim 1, including implanting the localized source and drain regions using the gate electrode as an implant mask.

15. The method of claim 1, wherein removing the portions of the spacers includes removing upper portions of the spacers while leaving intact lower portions of the spacers, and implanting the localized source and drain regions includes implanting dopant ions through the lower portions of the spacers into the substrate.

16. The method of claim 15, wherein the lower portions of the spacers block a substantial amount of the dopant ions impinging thereon from passing into the substrate while allowing passage of a substantial amount of the dopant ions impinging thereon to pass into the substrate.

17. The method of claim 1, wherein removing the portions of the spacers includes removing all of the spacers.

18. The method of claim 1, wherein removing the portions of the spacers creates voids in the trench between the gate electrode and the sidewalls.

19. The method of claim 18, including partially filling the voids in the trench after implanting the localized source and drain regions, thereby leaving air gaps in unfilled portions of the voids.

20. The method of claim 18, including completely filling the voids in the trench after implanting the localized source and drain regions.

21. The method of claim 1, including forming a channel adjacent to the bottom surface of the trench and between the localized source and drain regions.

22. The method of claim 21, wherein a length of the channel is less than half of a length between the sidewalls.

23. The method of claim 1, wherein forming the gate electrode includes depositing a blanket layer of gate electrode material over the substrate and into the trench, and then polishing the gate electrode material until the gate electrode is substantially aligned with a top surface of the substrate.

24. The method of claim 23, wherein substantially all of the gate electrode is within the trench.

25. The method of claim 1, wherein the gate electrode is polysilicon and the gate insulator is silicon dioxide.

26. The method of claim 1, wherein the spacers are silicon dioxide.

27. The method of claim 1, wherein the IGFET is an N-channel MOSFET.

28. The method of claim 1, wherein the IGFET is a P-channel MOSFET.

29. An integrated circuit chip including the IGFET of claim 1.

30. An electronic system, including a microprocessor, a memory, and a system bus, wherein the electronic system further includes the IGFET of claim 1.

31. A method of forming an IGFET in a trench, comprising the steps of:
    providing a semiconductor substrate;
    patterning a photoresist layer with an opening over the substrate;
    applying an anisotropic etch through the opening in the photoresist layer to form a trench partially through the substrate, wherein the trench has opposing sidewalls and a bottom surface;
    forming oxide spacers on the sidewalls and on outer portions of the bottom surface of the trench adjacent to the sidewalls while exposing a central portion of the bottom surface of the trench between the outer portions of the bottom surface;
    forming a gate oxide on the central portion of the bottom surface of the trench;
    forming a polysilicon gate electrode on the gate oxide and the oxide spacers, wherein the polysilicon gate electrode is spaced from and electrically isolated from the substrate by the gate oxide and the oxide spacers;
    removing portions of the oxide spacers to form voids in the trench between the polysilicon gate electrode and the sidewalls;
    implanting localized source and drain regions through the voids and through the outer portions of the bottom surface of the trench into the substrate using the polysilicon gate electrode as an implant mask for the central portion of the bottom surface of the trench after removing the portions of the oxide spacers, wherein the localized source and drain regions are adjacent to the outer portions of the bottom surface of the trench;
    implanting sidewall source and drain regions into the substrate and adjacent to the sidewalls; and
    forming a source and a drain in the substrate, wherein the source includes the localized source region merged with the sidewall source region, the drain includes the localized drain region merged with the sidewall drain region, and the localized source and drain regions define a channel in the substrate adjacent to the central portion of the bottom surface of the trench.

32. The method of claim 31, including implanting the sidewall source and drain regions and the localized source and drain regions simultaneously.

33. The method of claim 31, including implanting the sidewall source and drain regions before implanting the localized source and drain regions and before forming the trench.

34. The method of claim 31, including implanting the sidewall source and drain regions both during and after implanting the localized source and drain regions.

35. The method of claim 31, including:
    removing upper portions of the oxide spacers while leaving intact lower portions of the oxide spacers so that the voids are spaced from the outer portions of the bottom surface of the trench; and
    implanting the localized source and drain regions through the lower portions of the oxide spacers into the substrate.

36. The method of claim 31, including:
    removing all of the oxide spacers so that the voids extend to the outer portions of the bottom surface of the trench; and
    implanting the localized source and drain regions directly into the substrate.

37. The method of claim 31, including:
    removing all of the oxide spacers so that the voids extend to the outer portions of the bottom surface of the trench;
    growing secondary oxide spacers on the outer portions of the bottom surface of the trench so that the voids are spaced from the outer portions of the bottom surface; and
    implanting the localized source and drain regions through the secondary oxide spacers into the substrate.

38. The method of claim 31, wherein the localized source and drain regions are lightly doped regions and the sidewall source and drain regions are heavily doped regions.

39. The method of claim 31, including:
    removing upper portions of the oxide spacers while leaving intact lower portions of the oxide spacers so that the voids are spaced from the outer portions of the bottom surface of the trench; and
    applying a heavy dose of dopant ions to simultaneously implant the localized source and drain regions and the sidewall source and drain regions;
    wherein the localized source and drain regions are heavily doped regions, and the lower portions of the oxide spacers block a substantial amount of the dopant ions impinging thereon from passing into the substrate while allowing a substantial amount of the dopant ions impinging thereon to pass into the substrate so that the localized source and drain regions are lightly doped regions.

40. The method of claim 31, including:

removing all of the oxide spacers so that the voids extend to the outer portions of the bottom surface of the trench;

growing secondary oxide spacers on the outer portions of the bottom surface of the trench so that the voids are spaced from the outer portions of the bottom surface; and applying a heavy dose of dopant ions to simultaneously implant the localized source and drain regions and the sidewall source and drain regions;

wherein the localized source and drain regions are heavily doped regions, and the secondary oxide spacers block a substantial amount of the dopant ions impinging thereon from passing into the substrate while allowing a substantial amount of the dopant ions impinging thereon to pass into the substrate so that the localized source and drain regions are lightly doped regions.

41. The method of claim 31, including:

applying a heavy dose of dopant ions to implant the sidewall source and drain regions as part of a continuous doped layer in the substrate;

applying the anisotropic etch to split the doped layer into the sidewall source and drain regions; and then applying a light dose of dopant ions to implant the localized source and drain regions.

42. The method of claim 31, wherein the source and the drain extend to a top surface of the substrate, and the polysilicon gate electrode is substantially aligned with the top surface.

* * * * *